United States Patent [19]

Ernst et al.

[11] 4,327,425

[45] Apr. 27, 1982

[54] METHOD FOR THE RECORDING OF SPIN RESONANCE SPECTRA AND AN APPARATUS FOR THE IMPLEMENTATION OF SUCH METHOD

[75] Inventors: Richard R. Ernst, Winterthur; Walter P. Aue, Zürich, both of Switzerland

[73] Assignee: Spectrospin AG, Switzerland

[21] Appl. No.: 60,286

[22] Filed: Jul. 25, 1979

[30] Foreign Application Priority Data

Aug. 2, 1978 [DE] Fed. Rep. of Germany ....... 2833853

[51] Int. Cl.³ .............................................. G11C 13/00
[52] U.S. Cl. ................................................... 365/152
[58] Field of Search ......................... 365/152; 307/238

[56] References Cited

U.S. PATENT DOCUMENTS 3,585,494  6/1971  Bozanic .............................. 365/152
3,833,931  9/1974  Bonori et al. ....................... 365/152

Primary Examiner—Terrell W. Fears

[57] ABSTRACT

A method for the recording of spin resonance spectra, in which the spins of a nuclear species of a sample located in a magnetic field are excited by a pulsed rf signal and the relaxation oscillations of the spins are repetitively sampled and recorded at predetermined times and in which a radio-frequency decoupling signal is irradiated upon the sample to reduce coupling to the spins of another nuclear species, is characterized in that the decoupling signal consists of a periodic sequence of pulse groups comprising several pulses each, the pulses being so short that the frequency mixture detectable in the pulses according to the Fourier analysis covers the entire range of spin resonances of the other nuclear species.

11 Claims, 6 Drawing Figures

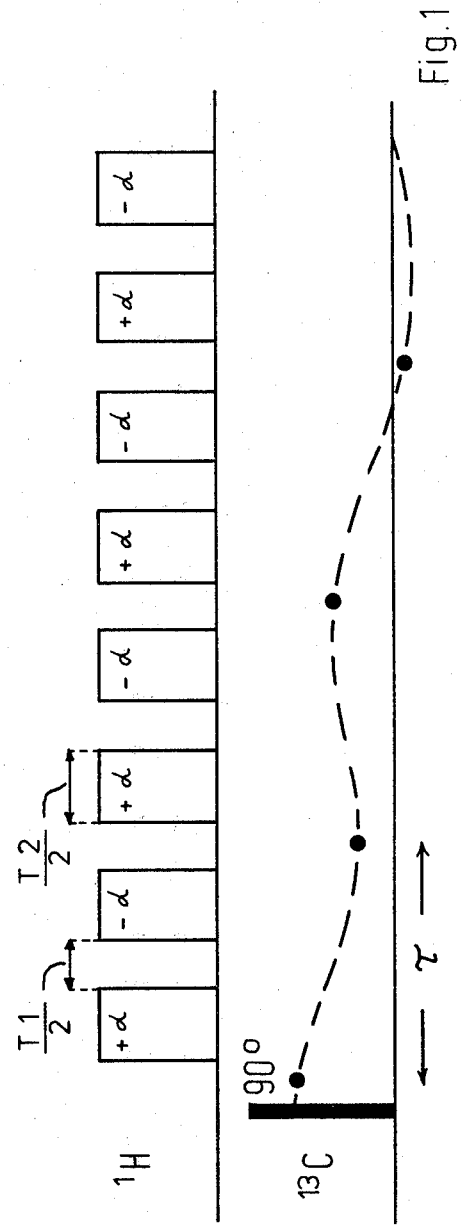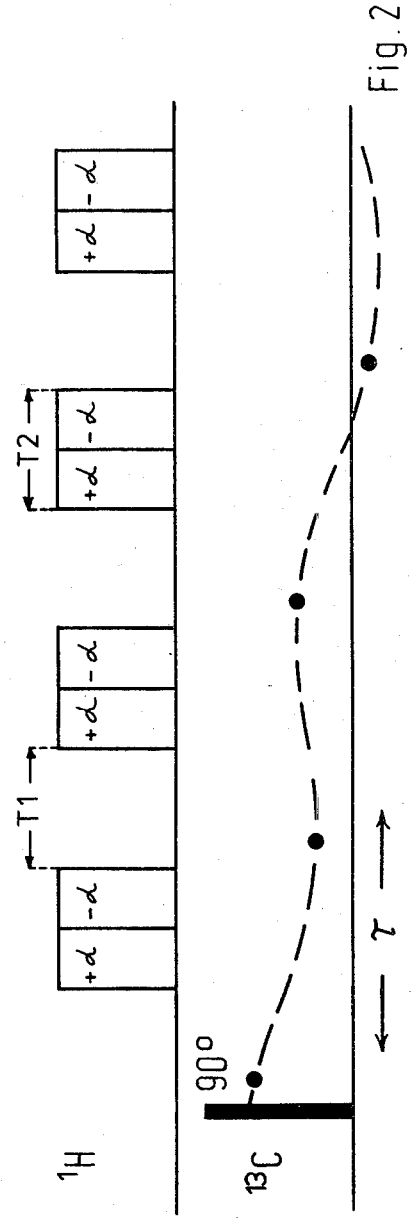

METHOD FOR THE RECORDING OF SPIN RESONANCE SPECTRA AND AN APPARATUS FOR THE IMPLEMENTATION OF SUCH METHOD

The invention relates firstly to a method for the recording of spin resonance spectra, in which the spins of a nuclear species of a sample located in a magnetic field are excited by means of a pulsed rf signal and the relaxation oscillations of the spins are repetitively sampled and recorded at predetermined intervals, and in which a rf decoupling signal is irradiated upon the sample to reduce coupling with the spins of another nuclear species.

When examining the spin resonances of samples containing compounds of hydrogen and carbon, the resonance line of a C13 atom, after excitation of C13 spins, is split up into several lines whose number depends on the number of the associated protons, so that a multiplet appears instead of a single line. It is known that the resonances can be recorded by exciting the C13 spin oscillations by a short rf pulse, then measuring at regular intervals the amplitude of the superimposed relaxation oscillations (interferogram) and storing them and finally computing the individual resonance frequencies on a computer using the Fourier analysis. The above-mentioned heteronuclear spin coupling, which causes the formation of multiplets, makes the graphical representation of the resonance frequency spectrum very complex because the individual multiplets partially overlap, and the spectrum does not show the individual clean multiplets but the addition of their amplitudes so that inspection of the spectrum will often not provide evidence of which resonance frequencies belong to which multiplets. As is known, this phenomenon is not limited to C13 spectra.

A method, referred to as "off resonance decoupling", already exists in which a reduction of proton spin coupling with the C13 spins is achieved by irradiating a single-frequency rf signal upon the sample, the frequency being close to, but outside, the frequency range within which proton spin oscillations occur. The frequencies of both the proton spins and the irradiated rf signal are far off the oscillation frequency range of the C13 spins.

The result of reduced coupling as described above is that the resonance lines belonging to a specific multiplet move closer together such that the overlapping of selected multiplets is eliminated, allowing the spectrum to be interpreted more easily. A disadvantage found in the method of off resonance decoupling is that it provides different scaling factors in that decoupling for those proton spins whose resonant frequency or Larmor frequency is relatively close to the frequency of the irradiated decoupling signal is greater, whereas decoupling for those proton spins whose Larmor frequency is further off the frequency of the decoupling signal is smaller so that the overlapping of multiplets cannot be avoided particularly for the latter type of protons.

It is the object of the present invention to provide a method of the type described at the beginning in which the reduction of coupling is more uniform than in the off resonance decoupling method. This object is achieved according to the invention in that the decoupling signal consists of a periodic sequence of pulse groups, each comprising several pulses, with the pulses being so short that the frequency mixture found in the pulses according to the Fourier analysis covers the entire spin resonance range of the other nuclear species.

The advantage of the invention is that, by proper selection of the number of pulses in a pulse group, the pulse lengths, their amplitude, their spacing, their carrier frequency and the phase positions of the various pulse carriers with respect to each other, decoupling can arbitrarily be adjusted stronger or weaker and the desired degree of uniformity of coupling within a predetermined range of resonant frequencies can also be achieved.

The rf pulses are preferably selected so that the rf pulses of a pulse group result in a total rotation of the spin momenta by 0° such that the spin system will again find the same conditions for its motion after the application of the rf pulses of a pulse group. In one embodiment of the invention the pulse group of the decoupling signal contains at least one pair of rf pulses, one of which rotates the spin momenta of the other nuclear species by an angle $\alpha$ and the other by an angle $-\alpha$. This property is in particular exhibited by rf pulses having the same amplitude and duration but being of opposite phase.

In another embodiment the rf pulses are selected to that they cause a total rotation of the spin momenta by $n \times 360°$ ($n=1, 2, 3, \ldots$).

The rf pulses of the decoupling signal preferably have the same carrier frequency which preferably lies within the range of the spin resonance frequencies to be decoupled. The rf pulses need not be synchronous with signal sampling. In this way it is possible to leave the rf pulse repetition rate constant while the signal sampling rate is changed so that the scaling factor (reduction in coupling) remains unchanged. If the rf pulse repetition rate is also changed, it may be appropriate to change, for instance, the length of the rf pulses to keep scaling constant. If there is a great difference between the spin resonance frequencies of the two nuclear species as, for example, in the $^1$H and $^{13}$C nuclei, there is no risk of the non-synchronous coupling signal causing substantial disturbance in the reception of the spin resonances.

The cycle rate at which the rf pulse groups are repeated must not be too small; for many cases it is considered sufficient to make this rate at least two to five times J (coupling), whose dimension is that of one frequency.

It is, however, also possible to make the periodic decoupling pulse groups synchronous with the signal sampling rate, in which case the signal samplings should conveniently occur in the gaps between the rf pulses of the decoupling signal.

In the latter case it is sufficient to have a single pair of rf pulses, which rotate the spin momenta of the other nuclear species by an angle $\alpha$ and $-\alpha$, between every two samplings, but there may also occur several such pulse pairs between two samplings. It may be practical to arrange the pulses in each pulse pair so that they always cause the same sequence of rotation, i.e. to design, for example, the first pulse of a pulse pair always so that it causes rotation by the angle $\alpha$.

The rf pulses are generated by gating a radio frequency oscillation; since the pulses are so short that their frequency spectrum obtained through the Fourier analysis covers the entire resonant range of the other nuclear species, coupling with all spins of the other nuclear species is thus reduced.

Surprisingly, it has been found that said pulses, and in particular pulse sequences fulfilling the cyclic property (sum of the flip angles per pulse group=0°), cause a reduction in coupling which is relatively independent of the spin frequency. Thus, scaling is much more uniform compared with off resonance decoupling.

It is a known method to apply a sequence of relatively short rf pulses to the sample with one rf pulse being issued in the gap between two samplings. In this method the frequency of the rf oscillations is also within the resonant frequency range of the proton spins. This known method, however, causes the selective decoupling of a single proton whose resonant frequency coincides with the decoupling frequency because only one component of the frequency spectrum of the rf pulse lies within the relevant range.

It is possible to select pulse frequencies with pulses of different lengths, amplitudes and phases. Preferably, however, the above-described pulse pairs are used consisting of pulses of equal amplitude and duration and opposite phase so that the individual pulses of a pair flip the spin momenta in opposite directions and a total flip angle of 0° is obtained at the end of the second pulse of a pair.

All pulses of the decoupling signal may be spaced, and in particular the pulses occurring between two samplings may be apart. A pulse pair may be arranged so that the spacing between the neighbouring pulses of two different pulse pairs is equal to the spacing between the pulses of one and the same pair. In another embodiment of the invention the pulses occur contiguously, and in particular the pulses occurring between two samplings have no spacing between them while, however, a phase shift may occur between them.

The invention also relates to a device for the implementation of the method according to the invention, which is based on a setup consisting of a first radio-frequency generator generating oscillations of a frequency f1 and a first gate for generating a first rf pulse used to excite the spin system, a second rf generator producing oscillations of the frequency f2 and a second gate for the generation of a second sequence of rf pulses for spin decoupling, and further consisting of receiving means comprising a pre-amplifier and a storage device, with a pulse generator being provided for controlling the second gate and the pre-amplifier, the pulse generator issuing periodic pulses to control the pre-amplifier. According to the invention such device contains a unit for generating pulse groups comprising at least two rf pulses with the oscillation of frequency f2, and the rf pulses are so short that the frequency mixture found in the pulses according to the Fourier analysis covers the entire range of spin resonances of the other nuclear species. In one embodiment of the device according to the invention a phase shifter is connected to the output of the second rf generator, and to the output of the phase shifter is connected a third gate whose control input is connected to another control output of the pulse generator. In one embodiment the arrangement is such that the rf pulses of a pulse group always occur in the gap between two pulses controlling the pre-amplifier.

Further features and advantages of the invention are apparent from the subsequent description of the embodiments illustrated in the drawing showing details essential to the invention, and from the claims. The various features can be implemented individually or in any combination in an embodiment of the invention.

FIG. 1 shows a pulse scheme for a first embodiment of the method according to the invention where the two pulses of a pulse pair are spaced.

FIG. 2 shows a pulse scheme for another embodiment of the method according to the invention where the two pulses of a pulse pair are contiguous.

Figure 3:
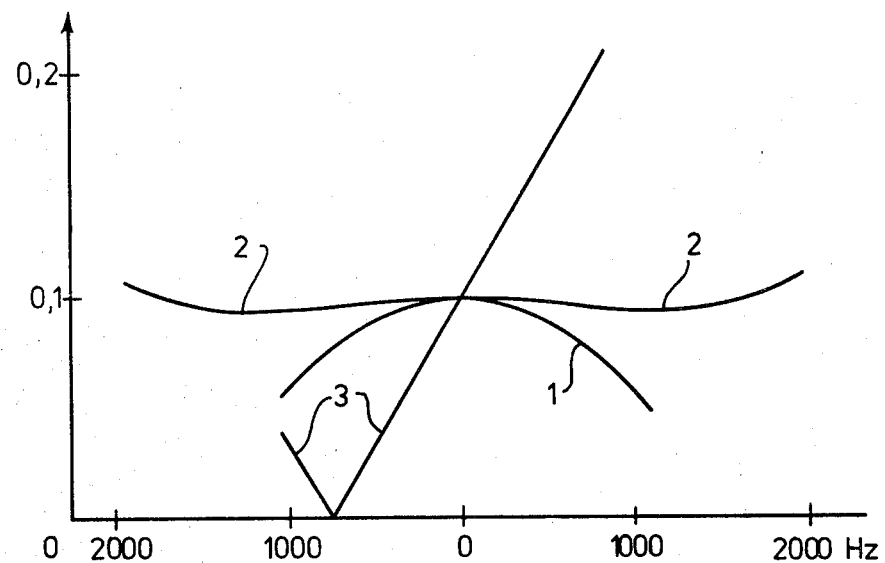
FIG. 3 is a representation of the frequency dependence when using decoupling according to FIG. 1 and 2 and, for comparison, when decoupling according to the off resonance technique.

The bold vertical bar in the lower part of FIG. 1 indicates a narrow radio-frequency pulse used to excite the C13 spin resonances of a sample, rotating the spins by 90°.

The amplitude curve, as a function of time, of the subsequent relaxation oscillations is indicated by a wavelike broken line. The amplitude of the relaxation oscillations is sampled at regular intervals T and stored in the memory of the computer. The sampling times and the corresponding amplitudes of the relaxation oscillations are indicated by bold dots in FIG. 1. The various resonant frequencies are computed from the sampled values in the usual way using the Fourier analysis.

The upper part of FIG. 1 shows in diagrammatical form that two radio-frequency pulses of equal amplitude and length are applied in the gap between every two succeeding samplings with the frequency of the rf oscillation being in the frequency range of the H1 (proton) spin frequencies. The pulses are so short that the frequency mixture found in the pulses according to the Fourier analysis covers the entire range of the possible proton spin resonances. The first pulse of each pair is designated as $+\alpha$ and the second pulse as $-\alpha$, the second pulse being exactly opposite in phase to the first pulse. The spacing between the two pulses of a pair and the spacing between the pulses of different pairs before or after the sampling moment are equal and amount to 0.5 T1. The length of each pulse is 0.5 T2. The position of the pulses with respect to the sampling times is arbitrary. In the pulse sequence shown in FIG. 1 the sampling times are exactly in the middle of the gap between two pulses belonging to different pulse pairs.

The only difference of the method illustrated by FIG. 2 as compared to the method according to FIG. 1 consists in that the first pulse of every pair has been moved close to the second pulse such that the two pulses, denoted by $+\alpha$ and $-\alpha$, of a pair follow each other without any substantial spacing. Since the two pulses are of opposite phase, a phase shift results exactly in the middle of the pulse pair. The spacing in time between the pulse pairs has in this method increased to T1, while the total length of the two pulses of a pulse pair amounts to T2.

The spacing between the sampling times is denoted by $\tau$ so that in these examples $\tau = T1 + T2$.

The scaling resulting from the method according to the invention can be computed using the Hamiltonian. Let the Hamiltonian of the unperturbed system, which has not been exposed to decoupling pulses, be $H_0$ and the Hamiltonian of the cyclic pulse frequency used for decoupling be $H_1(t)$. The cycle length shall be $\tau = T1 + T2$ as described above. It is then possible to compute the average Hamiltonian $\bar{H}_0$ by the following expressions (cf. J. D. Ellett and J. S. Waugh, J. Chem. Phys. 51, 2851 (1969)):

$$\bar{H}_o = \frac{1}{T} \int_0^T \tilde{H}_o(t) dt \tag{1}$$

where $$\tilde{H}_0(t) = L^{-1}(t) H_0 L(t) \tag{2}$$

where $$L(t) = T \exp\left(-i \int_0^t H_1(t_1) dt_1\right), \tag{3}$$

where T represents the Dyson time-ordering operator. Equation (1) results from a Magnus expansion approximated by the first term only. For more accurate calculations higher terms would have to be included as well.

Many different pulse sequences can be used for scaling. It has been found that the Hamiltonian of a system where N I-spins (proton spins) are coupled to a single S-spin (C13 spin) can be assumed in the following form:

$$\bar{H}_o = \Omega_S S_z + \sum_k \{\Omega_k + 2\pi J_{Sk} S_z\} I_{kz} + \sum_{k<l} 2\pi J_{kl} I_k I_l \tag{4}$$

In the presence of any periodic pulse sequence applied to the I-spins this operator leads to the average Hamiltonian $$\bar{H}_o = \Omega_S S_z + \sum_k \{\Omega_k + 2\pi J_{Sk} S_z\} \{a I_{kx} + b I_{ky} + c I_{kz}\} + \sum_{k<l} 2\pi J_{kl} I_k I_l, \tag{5}$$

with constants a, b, and c depending on the particular pulse sequence used. With regard to the S-spin spectrum, this Hamiltonian is equivalent to the form $$\bar{H}_o = \Omega_S S_z + q \sum_k \{\Omega_k + 2\pi J_{Sk} S_z\} I_{kz} + \sum_{k<l} 2\pi J_{kl} I_k I_l \tag{6}$$

which is identical to $H_0$ except for the uniform scaling factor $q = \sqrt{a^2 + b^2 + c^2}$. For the pulse sequence in FIG. 1, one finds the following scaling factor:

$$q = \frac{1}{T1 + T2}\left[\tfrac{1}{2}T1^2(1 + \cos\alpha) + 2\frac{T2^2}{\alpha^2}(1 - \cos\alpha) + 2\frac{T1 T2}{\alpha}\sin\alpha\right]^{\frac{1}{2}} \tag{7}$$

For the pulse sequence in FIG. 2, the following value is obtained:

$$q = \left[\frac{1}{T1 + T2} T1^2 + 2\frac{T2^2}{\alpha^2}(1 - \cos\alpha) + 2\frac{T1 T2}{\alpha}\sin\alpha\right]^{\frac{1}{2}} \tag{8}$$

By proper selection of T1, T2 and $\alpha$ it is possible to select the scaling factors for the pulse sequences shown and also for other pulse sequences.

A noteworthy property of the pulse sequence in FIG 2 is that for large flip angles, i.e. for a high rf field strength, it becomes independent of the field strength because in the last formula above the brackets contain a term that is independent of $\alpha$. This is an advantage because it is not possible in practice to achieve a totally homogeneous rf field in the sample.

FIG. 3 shows the scaling factor when applying a specific pulse sequence according to FIG. 1 (curve 1), when applying a specific pulse sequence according to FIG. 2 (curve 2), and, for comparison, the scaling factor for off resonance decoupling (curve 3). A scaling factor of 0 means total decoupling and thus complete suppression of multiplets, while a scaling factor of 1 means full coupling, i.e. no reduction in the width of multiplets.

For the curves 1 and 2, the offset frequency 0 plotted on the horizontal axis is the same as the frequency of the rf signal applied for decoupling, and for curve 3, the position of the rf signal used for decoupling is obtained from the intersection of the two branches of the curve with the 0-axis for the scaling factor.

As was mentioned above, curve 3 shows a very large dependence of scaling on the position of the proton resonance frequencies relative to the irradiated decoupling frequency. This dependence has been greatly reduced in curve 1, and in curve 2 scaling (scaling factor in this example is 0.1) is almost independent of the proton spin resonance frequency within the range shown in FIG. 3.

The curves shown in FIG. 3 have been computed for a two-spin ½ system, and in addition curve 2 has been compared with measured values for $^{13}CHCl_3$, and the values agreed very well. For curve 2 (corresponding to the pulse sequence in FIG. 2), with a cycle time of $\tau = 270$ μs (determined by the required sampling rate), the optimal combination of pulse length and aplitude for minimum frequency dependence of scaling was found to be at the following values: T2/2 = 112 μs (i.e. T2 = 224 μs and $\gamma B_2/2\pi = 7500$ Hz, where $\gamma$ is the gyromagnetic ratio and $B_2$ is the magnetic field strength in the sample produced by the radio frequency.

For the pulse sequence in FIG. 1 (curve 1 in FIG. 3) and the same rf field strength, a pulse length of T2/2 = 87 μs leads to 10% scaling.

Figure 4:
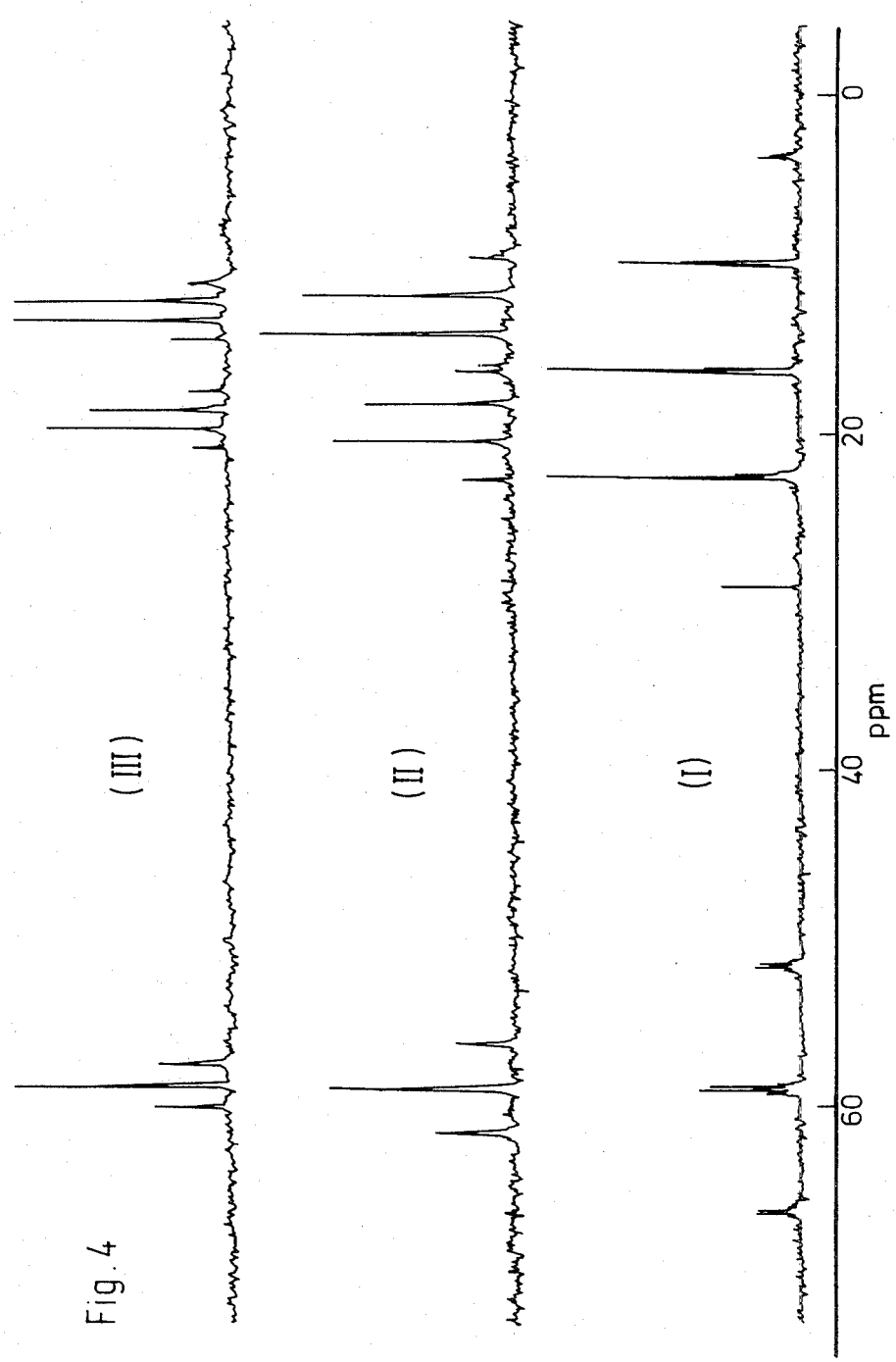
FIG. 4 shows three representations of a carbon—13 spectrum with different scalings.

FIG. 4 shows scaled carbon-13 spectra of ethylacetate obtained when using the technique according to FIG. 2. Curve (I) shows the spectrum without proton irradiation, i.e. with unreduced coupling. Curve (II) shows 35.6% scaling, i.e. the spacing between the frequencies of the individual multiplets has been reduced to 35.6% of the spacing in curve (I). The following values were selected in this case: $\gamma B_2/2\pi = 6.66$ kHz, T1 = 118 μs, T2 = 160 μs.

Curve (III) represents a scaling of 17.8%. Here, the following values were selected: $\gamma B_2/2\pi = 6.66$ kHz, T1 = 78 μs, T2 = 200 μs. The decoupler frequency has been positioned 350 Hz down-field from $CH_2$ resonance.

The abscissa in FIG. 4 denotes the deviation of the resonance frequencies in parts per million (ppm) from a reference spectrum obtained by measuring TMS (tetramethylsilane).

From FIG. 4 it is apparent that with a scaling of 17.8% two clearly separate quarters are recognisable in the right-hand part of the curve, whereas with scaling by 35.6% they still partially overlap, and with full coupling (curve I) it is not recognisable that the five resonances visible in the right-hand part of this curve belong to two quarters.

Comparison, in particular with the triplet visible in the left-hand part of the curves, shows that scaling has not changed the chemical shift, i.e. the medium frequency of the triplet is the same for the three curves. This applies also to the medium frequency of the quartets in the right-hand part of the curve, although this is not so easily recognisable because the medium frequency does not coincide with a resonance point.

Figure 5:
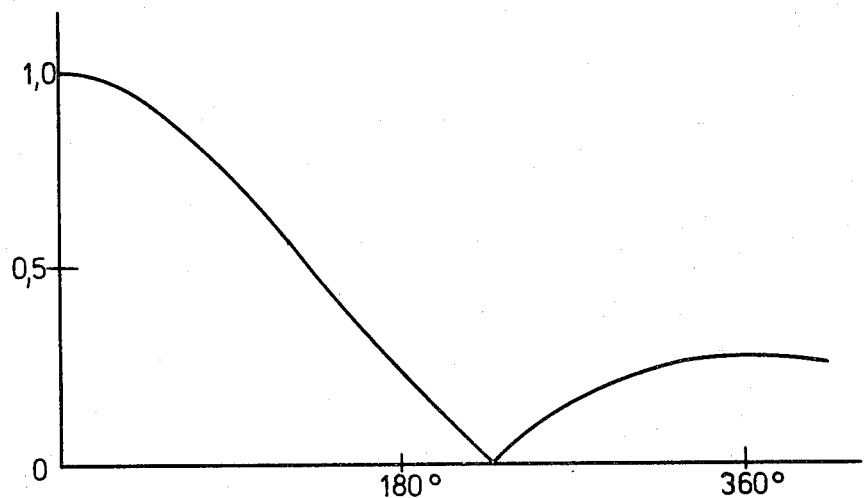
FIG. 5 shows the variation of the scaling factor with the flip angle $\alpha$ when using the pulse sequence according to FIG. 1.

FIG. 5 represents the scaling factor as a function of the flip angle for the pulse sequence according to FIG. 1 with the above-mentioned values for this pulse sequence, which also apply to curve 1 in FIG. 3. For very small flip angles the scaling factor is 1, denoting that there is not yet any decoupling, and the scaling factor decreases with increasing flip angle until it reaches a value of 0 at a flip angle of approximately 230°. As the flip angle increases further, the scaling factor also increases up to a value of about 0.3 at a flip angle of approximately 360°.

Figure 6:
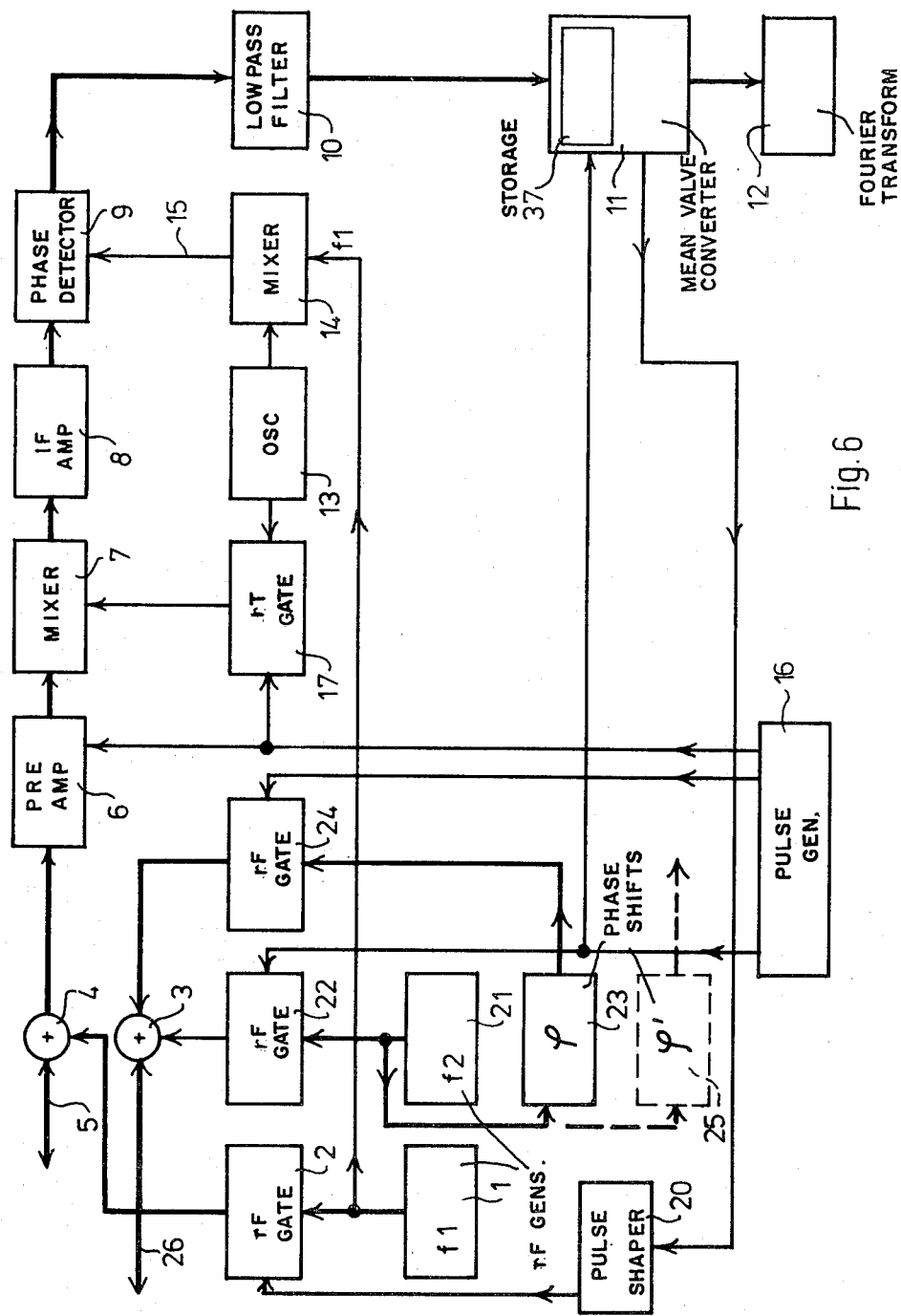
FIG. 6 shows a block diagram of the essential parts of a spin resonance spectrometer set up for carrying out the method.

The device illustrated in FIG. 6 has a first rf generator 1 and a first rf gate 2 which allows the rf oscillation of frequency f1 generated by the first rf generator to be pulse-modulated. Thus, the output signal of the first rf gate is a first sequence of rf pulses with the carrier frequency f1. The 90° excitation pulse for the C13 spectrum represented in the lower parts of FIG. 1 and 2 is such an rf pulse generated by the first rf gate 2. This excitation pulse will usually, as in this embodiment, be issued not only once but with a specific repetition rate. A second rf generator 21 generates an rf oscillation with the frequency f2 which, on the one hand, is applied to a second rf gate 22 allowing it to be pulse-modulated, and, on the other hand, via a phase shifter 23 to a third rf gate 24 which also allows the oscillation output of the phase shifter 23 to be pulse-modulated. The outputs of the rf gates 22 and 24 are connected to a branch point 3 from which the rf pulse sequences are routed via line 26 to a decoupling coil located in the sample head of the spin resonance spectrometer. The sample head, containing the sample to be examined, is located in a homogeneous magnetic field as is well known in the art. The rf pulse sequence generated by the rf generator 1 and the associated rf gate 2 is applied, via the branch point 4 and line 5, to the sample head to excite the spin system of the sample contained therein. The signal issued by the sample is fed, via the branch point 4, to the receiving means which comprises a pre-amplifier 6, a mixer stage 7, an IF amplifier 8, a phase detector 9, a low-pass filter 10, a mean-value converter 11, and a Fourier transformer 12. The mean-value converter need not be provided if the spectrum is produced only by a single excitation pulse of the frequency f1; it is used to improve the signal-to-noise ratio when a pulse sequence of the frequency f1 is used. The frequency required for heterodyning the signals received from the sample in the mixer stage 7 is supplied by a local oscillator 13, which is also connected to a second mixer stage 14 which is also provided with the output signal from the first rf generator 1 and which supplies on a line 15 an intermediate frequency fed to the phase detector 9 for rectifying the received signal.

The rf gates 22 and 24 are controlled by the output signals of a pulse generator 16 which also supplies clock signals to the pre-amplifier 6 and an rf gate 17 connected between the local oscillator 13 and the first mixer stage 7. Finally, the pulse generator 16 is connected to the mean-value converter 11, while the mean-value converter 11 is connected via a pulse shaper 20 to the first rf gate 2.

The pulse generator 16 is designed so that it enables the pre-amplifier 6 and the rf gate 17 at predetermined times corresponding to the bold dots shown in the dashed curves in FIG. 1 and FIG. 2 so that at these times the amplitude of the interferogram, or the relaxation signal, can be sampled, and that it generates, in the gap between two such samplings, a sequence of rf pulses with the carrier frequency f2 by enabling the rf gates 22 and 24. In the example, the phase shifter 22 causes a phase shift by 180°; hence, it may be a simple phase-inverter amplifier. Thus, exactly opposite-phase rf voltages of the frequency f2 are applied to the rf inputs of the gates 22 and 24. The rf pulses leaving the rf gate 22 correspond to the pulses designated as $+\alpha$ in FIGS. 1 and 2, while the rf pulses leaving the rf gate 22 correspond to the rf pulses designated as $-\alpha$ in FIGS. 1 and 2. The pulse generator 16 is designed so that the duration of the pulses issued by the rf gates 22 and 24 can be adjusted as well as the spacing between a $+\alpha$ pulse and a subsequent $-\alpha$ pulse and also the position in time of the pulses relative to the sampling times. The pulse generator 16 can therefore be adjusted so that it causes, for example, sampling and the application of the decoupling pulses according to FIG. 1 or, when differently adjusted, sampling and the application of the decoupling pulses according to FIG. 2.

As described above, the pulses leaving the rf gate 24 are always exactly opposite in phase to the frequency generated by the second rf generator 21. It may be practical to design the pulse generator 16 so that the rf gates 22 and 24 are enabled and disabled at such times that also the leading edges and/or the trailing edges of the pulses generated by these rf gates are exactly of opposite phase so that, for example, the $+\alpha$ pulse always starts with a positive half-wave of the rf oscillation and ends with a negative half-wave, while the $-\alpha$ pulse starts with a negative half-wave and ends with a positive half-wave. The carrier frequency f2 generated by the second rf generator 21 is positioned within or near the frequency band of the proton spin frequencies whose coupling to the C13 spectrum to be examined in the embodiment is to be scaled.

The pulse issued by the first rf gate 2 basically excites all spins of the spin system of the sample in a uniform way. The pulses issued by the rf gates 22 and 24 reduce the proton spin coupling in an adjustable way. Since the frequencies of different amplitudes of the spectrum occur at the same time, a mixture of all frequencies of the spectrum is supplied to the receiving means of the spectrometer. Therefore, a low-frequency interferogram appears at the low-pass filter 10. After the excitation of the sample, each interferogram begins, of course, by an rf pulse of gate 2. A low-frequency interferogram is a signal with an amplitude varying in time, the amplitude being sampled at predetermined intervals, as explained above, and stored in the storage 37 of the mean-value converter 11. Subsequently, the amplitudes of the spectrum are computed from the stored amplitude values using the Fourier transformer 12. Sampling of the interferogram at times when neither the rf gate 2 nor the rf gates 22 and 24 issue pulses permits undisturbed reception of the interferogram as is well known.

The gate pulses which the pulse generator applies to the second rf gate 22 also control address stepping in the storage 37 of the mean-value converter. After complete stampling of the interferogram a trigger signal for the pulse shaper 20 is derived from the last address of the storage 37, the signal being a gate pulse for the first rf gate 2 of the illustrated device. Accordingly, the gate pulses for the first rf gate 2 are also derived from the gate pulses for the second rf gate 22.

If more than two pulses of the carrier frequency f2 for the reduction of coupling are to be issued during the interval between two succeeding sampling times of the interferogram, additional phase shifters can be connected to the output of the second rf generator 21. Only one of these phase shifters with the reference number 25 is indicated with a dashed outline in FIG. 6. In this case another rf gate to which the pulse generator also applies the proper trigger pulses is to be connected to the outputs of each of these additional phase shifters as in the case of the phase shifter 23. If three or more decoupling pulses are generated between two sampling times, as described, the phase shift of each of the phase shifters including the phase shifter 23 must be adjusted so that coupling is scaled as desired. This applies also to the pulse length, the pulse spacing and, if appropriate, also to the pulse amplitude. If the pulse amplitude is to be varied, this can be achieved by designing the pulse generator so that it can issue control pulses of different amplitudes and by replacing the rf gates 22 and 24 as well as the additional rf gates, if any, connected to the additional phase shifters by modulators which allow also the amplitude of the issued pulses to be varied. Another way of generating more than two rf pulses is to have each of the rf gates 22 and 24 triggered more than once by the pulse generator.

In the discussion of FIGS. 1-6 it has so far been assumed that the rf pulses generated by the rf gates 22 and 24 and used for decoupling are synchronous with the sampling process carried out by enabling the pre-amplifier 6 and the rf gate 17. However, this is not necessary, and an asynchronous mode is possible as well. In this case, FIGS. 1 and 2 represent merely an accidental position of the sampling times relative to the rf pulses used for decoupling. For an asynchronous mode of operation, the device illustrated in FIG. 6 is modified so that the pulse generator 16 is subdivided into two pulse generators, one of which triggers the rf gates 22 and 24 as described above, while the other enables the pre-amplifier 6 and the rf gate 17, this setup allowing the sampling rate determined by the other pulse generator to be changed without changing the trigger frequency for the rf gates 22 and 24. For an asynchronous mode of operation it would also be appropriate to connect the mean-value converter 11 to the pulse generator which enables the pre-amplifier 6 and, therefore, to connect the line in the circuit diagram in FIG. 6 which controls the address stepping in the storage 37 not to that line of the pulse generator which is routed to the rf gate 22 but to that line which leads to the pre-amplifier 6 and, if necessary, to insert a delay circuit in this address stepping line.

As pulse generator may e.g. be used the Hewlett Packard Programmable Signal Source Model 8165 A, the Systron-Donner Model 116 Pulse Generator or the Tektronix PG 508 Pulse Generator.

We claim:

1. A method for determining the spin resonance spectra of a selected nuclear species in a sample comprising the steps of applying a pulsed rf signal of a frequency $f_1$ to said sample located in a magnetic field to excite the spin of at least said selected species, applying to said sample an rf frequency decoupling signal having a frequency $f_2$ different from that of $f_1$, said decoupling signal consisting of a periodic sequence of pulse groups at least in part occurring after the application of the rf signal of frequency $f_1$, said pulse groups comprising several pulses, the pulses being so short that the frequency mixture detectable in the pulses according to the Fourier analysis covers the entire range of spin resonances at least of the nuclear species other than said given species, and that the pulses of a pulse group causes a total rotation of the spin momenta of the other nuclear species by $n \times 360°$ ($n = 0, 1, 2, 3 \ldots$), and repetitively sampling and recording the relaxation oscillations of the spins of said given species at predetermined intervals.

2. The method according to claim 1, wherein each pulse group comprises at least one pair of rf pulses having the same amplitude and the same duration and being of opposite phase to cause a total rotation of the spin momenta of 0°.

3. The method according to claim 1, wherein the rf pulses of the decoupling signal all have the same carrier frequency.

4. The method according to claim 1, wherein the carrier frequency of the rf pulses of the decoupling signal is within the range of the spin resonance frequencies to be decoupled.

5. The method according to claim 1, wherein the pulses of the decoupling signal are spaced.

6. The method according to claim 1, wherein the pulses of the decoupling signal are contiguous.

7. The method according to claim 1, wherein the periodic sequence of pulse groups of the decoupling signal is synchronous with sampling.

8. The method according to claim 7, wherein the pulses of a pulse group occur in the gap between two samplings.

9. Apparatus for determining the spin resonance spectra of a selected nuclear species in a sample located in a magnetic field spin system, comprising a first rf generator for generating an rf oscillation of the frequency $f_1$ and a first gate for generating a first rf pulse used to excite the spin system and a second rf generator for generating a radio-frequency oscillation of the frequency $f_2$ and a second gate for generating a second sequence of rf pulses for spin decoupling, receiving means including a pre-amplifier, a storage, means for controlling the second gate and the pre-amplifier comprising a pulse generator issuing periodic pulse groups having at least two rf pulses of the carrier frequency $f_2$, said pulses being so short that the frequency mixture detectable in the pulses according to the Fourier analysis covers the entire range of the spin resonances of the other nuclear species.

10. The apparatus according to claim 9, wherein a phase shifter is connected to the second rf generator to whose output is connected a third gate for the generation of an rf pulse whose control input is connected to another control output of the pulse generator.

11. The apparatus according to claim 9, wherein the rf pulses of a pulse group occur between every two pulses controlling the preamplifier.

* * * * *